(12) United States Patent
Grushin

(10) Patent No.: US 7,072,920 B2
(45) Date of Patent: Jul. 4, 2006

(54) METHOD AND APPARATUS FOR DIGITAL FREQUENCY CONVERSION

(75) Inventor: Stanislav Grushin, San Jose, CA (US)

(73) Assignee: Genesis Microchip Inc., Alviso, CA (US)

( * ) Notice: Subject to any disclaimer, the term of this patent is extended or adjusted under 35 U.S.C. 154(b) by 797 days.

(21) Appl. No.: 10/101,305

(22) Filed: Mar. 18, 2002

(65) Prior Publication Data

US 2003/0173945 A1    Sep. 18, 2003

(51) Int. Cl.
G06F 7/52    (2006.01)
G06F 1/02    (2006.01)

(52) U.S. Cl. ........................... 708/103; 708/271
(58) Field of Classification Search ............. 708/103, 708/271
See application file for complete search history.

(56) References Cited

U.S. PATENT DOCUMENTS

| | | | |
|---|---|---|---|
| 3,414,720 A * | 12/1968 | Battarel | 708/103 |
| 5,382,913 A | 1/1995 | Carson et al. | |
| 5,422,835 A | 6/1995 | Houle et al. | |
| 5,796,392 A | 8/1998 | Eglit | |
| 5,828,250 A | 10/1998 | Konno | |
| 5,933,035 A | 8/1999 | Bezzant et al. | |
| 6,232,952 B1 | 5/2001 | Eglit | |
| 6,353,469 B1 | 3/2002 | Schaub et al. | |
| 6,356,123 B1 * | 3/2002 | Lee et al. | 327/115 |
| 2003/0174797 A1 | 9/2003 | Grushin | |

FOREIGN PATENT DOCUMENTS

| | | |
|---|---|---|
| EP | 0522274 A1 | 1/1993 |
| EP | 0778675 A1 | 6/1997 |
| EP | 0863612 A2 | 9/1998 |

OTHER PUBLICATIONS

International Search Report in corresponding PCT Application PCT/US03/08067 mailed Jun. 30, 2003.
EPO Office Action dated Jul. 18, 2005 for European Patent Application No. 03716528.9.
International Search Report for PCT Application PCT/US03/07707 mailed Jun. 30, 2003.
"A Digital Frequency Synthesizer with a Phase Accumulator", Hikawa et al., 1988 IEEE International Symposium on Circuits and Systems, Proceedings, vol. 1, p. 373-376.
Chinese Office Action dated Jan. 27, 2006 from corresponding Chinese Patent Application No. 03810801.1 (English translation enclosed).

* cited by examiner

Primary Examiner—Chuong D. Ngo
(74) Attorney, Agent, or Firm—Beyer Weaver & Thomas, LLP

(57) ABSTRACT

A general method is provided to achieve frequency conversion in an all-digital frequency conversion device that produces an output signal having a selectable phase and frequency that is substantially synchronous with the input signal to be converted. A multiplicity of time-shifted signals is generated, and appropriate ones are selected to set and reset an output signal. An apparatus, computing system, and software product that implement the present invention are also provided.

17 Claims, 9 Drawing Sheets

METHOD AND APPARATUS FOR DIGITAL FREQUENCY CONVERSION

CROSS REFERENCE TO RELATED APPLICATIONS

This application is also related to the following co-pending U.S. patent application Ser. No. 10/100,803, entitled "FREQUENCY CONVERTER AND METHODS OF USE THEREOF" naming Stanislav Grushin as inventor filed Mar. 18, 2002 which is incorporated by reference in its entirety.

FIELD OF THE INVENTION

The present invention relates generally to frequency converters. More particularly, the invention relates to a digital frequency converter having a deterministic phase error.

BACKGROUND OF THE INVENTION

In many types of electrical systems it is desirable to generate clock signals with various frequency and phase relationships synthesized from certain reference signals. A common way to synthesize derivatives of a reference signal is based upon the analog phase locked loop (PLL) frequency converter. Accordingly, FIG. 1 shows a traditional analog PLL 100 that takes a digital source frequency SCLK as an input to a source divider 104 that divides SCLK by an integer value S to create reference frequency $f_{REF}$. A negative feedback PLL control loop 105 is formed by a phase detector 106, a charge pump 108, a low pass filter 110, a voltage controlled oscillator (VCO) 112, and a feedback divider 114. Phase detector 106 performs a phase difference operation on $f_{REF}$ and feedback frequency $f_{BACK}$. That is, phase detector 106 generates a phase error signal $U_{ERR}$ that is zero when $f_{REF}$ and $f_{BACK}$ are equal, and varies inversely with their difference. The feed-forward part 107 of the PLL control loop generates an output, or destination, frequency DCLK from VCO 112 whose output frequency is controlled by $U_{ERR}$ through a voltage created by charge pump 108 and low pass filter 110. Specifically, charge pump 108 converts $U_{ERR}$ to a voltage signal that is smoothed by low pass loop filter 110, thereby providing a control voltage to VCO 112. The feedback path 113 of the PLL control loop feeds frequency output DCLK into feedback divider 114, which creates the $f_{BACK}$ signal by dividing DCLK by integer value F. The output frequency of DCLK is a multiple or fraction source frequency SCLK as determined by the ratio F/S.

PLL phase jitter, loop stability and response time are principally determined by analog charge pump 108 and low pass loop filter 110 components. Capacitive elements in these analog PLL components introduce significant loop time constants and phase jitter that result in loop behavior that is difficult to understand and predict, especially when the source frequency SCLK rapidly changes. One reason for this uncertainty, for example, is that capacitors are subject to thermal variation of their electrical characteristics. For at least these reasons, conventional analog PLLs are very difficult to practically use for accurate frequency conversion, especially when the source frequency SCLK is not a constant value. In addition to electrical performance limitations, there are significant costs associated with the implementation of conventional analog PLLs. For example, when implemented in an integrated circuit (IC), the analog PLL components take a significant portion of the final IC die area. Another significant cost associated with the analog PLL is that current IC device testing techniques require external IC access pins connected to the analog PLL for inspection by specialized testing equipment. In some cases, selection of dividers 114 and 104 can also present important cost and design problems. By way of example, if dividers with too few bits are used (e.g., 4) there would be a range of output frequencies that such a PLL could not produce due to the limited resolution of the dividers. However, it is often not practical to increase the number of bits in these dividers, as this can increases the compare period, resulting in larger and more costly capacitive elements in the analog PLL. Moreover, the problem of selecting a small divider ratio is made more difficult by the fact that many conventional clock sources are derived from crystal oscillators that come in relatively few discrete frequency values.

Instead of fixed-frequency crystal oscillators, some known methods implement a digital oscillator to generate DCLK. One conventional digitally controlled oscillator is called a discrete-time oscillator (DTO), and is shown by way of example in FIG. 2 as DTO 200. The DTO 200 includes an n-bit adder 202 that adds the n-bit increment value N (a scaling factor) to the previous output value of register 204, whereby the output value of register 204 is updated with the newly incremented value upon the next rising edge of a reference clock signal RCLK, thereby generating, over some number of RCLK cycles the n-bit staircase output represented by signal 206. The reference clock signal RCLK controls the duration of each step in the staircase output signal 206 by synchronizing when register 204 is updated with the next DTO output value determined by adder 202. After each period of the DTO output signal 206, a carry bit 208 is generated. Carry bit 208 represents the integer part of the DTO output frequency, and the staircase DTO output signal 206 contains information about the fractional part of each period. A counter unit (not shown) may accumulate the carries 208 generated over successive periods, thereby accumulating the integer part of the DTO's output for use by other system components. The DTO oscillation period is determined by the MODULO (i.e., the counting range $2^n$) of the DTO adder, the value of N, and the RCLK frequency $F_{RCLK}$ according to the following Equation (1):

$$F_{DCLK} = \frac{SF}{MODULO} \times F_{RCLK} \quad (1)$$

where SF is an n-bit scaling factor (e.g. N) that linearly determines the output frequency of the DTO.

Typically, the RCLK frequency MODULO are fixed, and the desired DTO output frequency is dynamically controlled by the value of N. Typically, MODULO=$2^n$, where n is number of DTO adder bits. In some embodiments the DTO output frequency is controlled by changing MODULO while holding N constant. It should be noted that DTO 200 can be used in frequency conversion by having a module (not shown) that analyzes the input frequency to convert, and calculates the appropriate value of N for the DTO to generate the desired DCLK output frequency. However, one problem that such DTO frequency converters have is that the rising-edge and falling-edge of the DCLK output signal may be substantially miss-aligned relative to ideal position because change in the DTO output is made at the rising edge of the reference clock, RCLK. As a result, the jitter of the DCLK signal edges may be up to one RCLK period, and the value of jitter may be significantly worse than that of the analog PLL. This is particularly important when even one instance of phase jitter in the DTO output frequency could not be tolerated.

One known way to reduce phase jitter in the DTO output frequency is to use a digital-to-analog converter (DAC) as illustrated by the exemplary block diagram 300 in FIG. 3. In the diagram, an n-bit value N sets the frequency of the n-bit DTO signal $f_{DTO}$, which is fed into output module 307 for signal conditioning. Output module 307 generates an arbitrary waveform with the same period as $F_{DTO}$ by taking the output of DTO 304 as a memory address for lookup table (LUT) 308 which inputs the appropriate values from each corresponding LUT address location into digital-to-analog converter (DAC) 310, which thereby generates the desired waveform that is smoothed by low-pass filter 312. The LUT and filter are usually included to reduce harmonic frequency distortion in the DTO output signal by blocking the highest harmonic frequencies and permitting principally the main clock frequency to pass through, there by also reducing, but not eliminating, phase jitter. Schmitt trigger 314 converts the analog representation of $F_{DTO}$ into a digital frequency SCLK that is fed into PLL 316 for next step of frequency conversion. The analog PLL smoothes the SCLK jitter, and, additionally, allows a reduction of the $f_{DTO}$ range relative to the DCLK range, which is important for the design of low-pass filter 312.

Important areas where frequency converters are often used include computer CRT and LCD monitors with digital interfaces. In such applications, there is a multiplicity of different digital clock frequencies that are generated, or converted from relatively few precise clock references. Functions performed that drive the need for many different clock frequencies include image shrinks and interpolation, and the different scanning frequencies required to support changes in image pixel dimensions.

Although known frequency converters have generally worked well, as digital systems require an ever-increasing number of precise digital clock frequencies, there is a need for an improved digital frequency converter design that is efficient to manufacture and test. In particular, it would be desirable to have an all-digital frequency converter that does not have an analog PLL.

SUMMARY OF THE INVENTION

To achieve the foregoing and other objects and in accordance with the purpose of the present invention, a method and apparatus for digital frequency conversion using only digital components is provided.

A general method is provided to achieve frequency conversion in an all-digital frequency conversion device that takes an input signal to be converted (conversion signal) and outputs a signal having a selectable frequency and phase. One embodiment of the general method includes determining frequency setting parameters, and generating a plurality of time-shifted signals. The frequency conversion process continues by selecting the appropriate time-shifted signals to set and reset an output signal at certain phase positions in the input conversion signal. For example, the output signal could be set at the start of the input conversion signal's period, and reset at the middle. The frequency conversion process generates the output signal that corresponds to the selected time-shifted set signal and the selected time-shifted reset signal, thereby producing a an output signal having a selectable frequency that is substantially synchronous with the input conversion signal.

In other aspect of the present method, the time-shifted signals may be generated in a variety of suitable ways including time-shifting a periodic reference signal. In other aspect of the present method, these time-shifted reference signals are further shaped into pulses that are appropriately used to set and reset the output signal.

In one embodiment, an apparatus for frequency conversion is provided that implements the present method. The apparatus includes a time shifting unit that takes the reference input signal and outputs the multiplicity of time shifted reference signals. The time shifted reference signals are fed into a pulse generator unit that creates the multiplicity of time shifted pulses. A pulse selector unit selects the appropriate time shifted pulses to set and reset the output signal. The pulse selector unit receives phase information corresponding to the input conversion signal that a digital phase analyzer unit provides to the pulse selector unit, which outputs a set signal and a reset signal to an output module to generate a corresponding digital output signal having a selectable frequency. The time shifting unit can be implemented by a delay-line in some embodiments. The output module could be implemented by a set-reset latch.

A computing system and software product that implements the present invention is also provided.

Other features, advantages, and object of the present invention will become more apparent and be more readily understood from the following detailed description, which should be read in conjunction with the accompanying drawings.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE EMBODIMENTS

The present invention will now be described in detail with reference to an embodiment thereof as illustrated in the accompanying drawings. In the following description, specific details are set forth in order to provide a better understanding of the present invention. It will be apparent, however, to one skilled in the art, that the present invention may be practiced without some or all of these specific details. In other instances, well-known steps and/or system components have not been described in detail in order to not unnecessarily obscure the present invention.

In view of the foregoing, and to achieve other objects of the invention, a method and apparatus for an all-digital frequency converter is provided that achieves synchronous frequency conversion having a deterministic jitter. Specifically the frequency converter has no analog PLL, whereby relatively efficient manufacturing and test methods for digital circuits can be leveraged.

Figure 1:
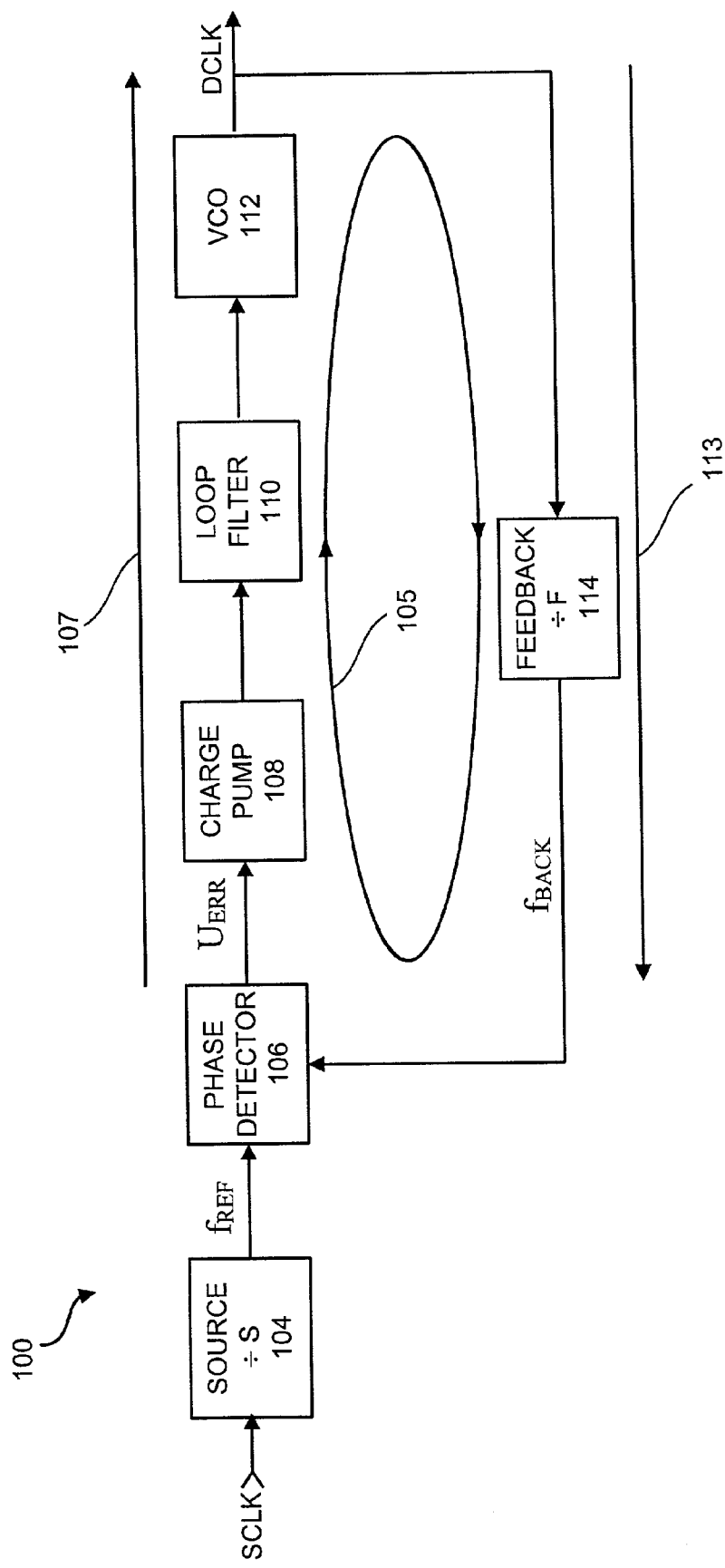
FIG. 1 illustrates an exemplary block diagram of a known analog phase locked loop (PLL) frequency converter.
Figure 2:
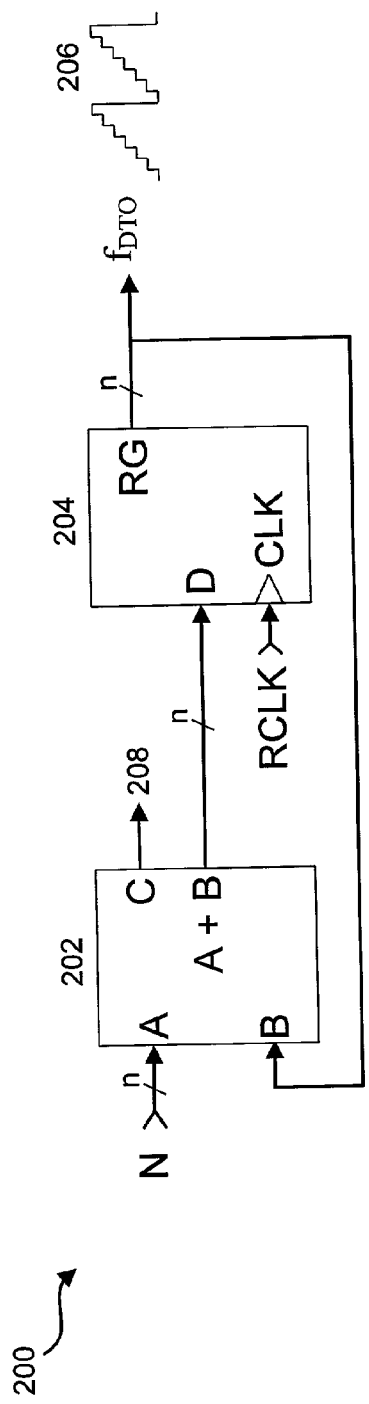
FIG. 2 is a diagram that illustrates an exemplary digital circuit implementation of a conventional discrete-time oscillator (DTO)
Figure 3:
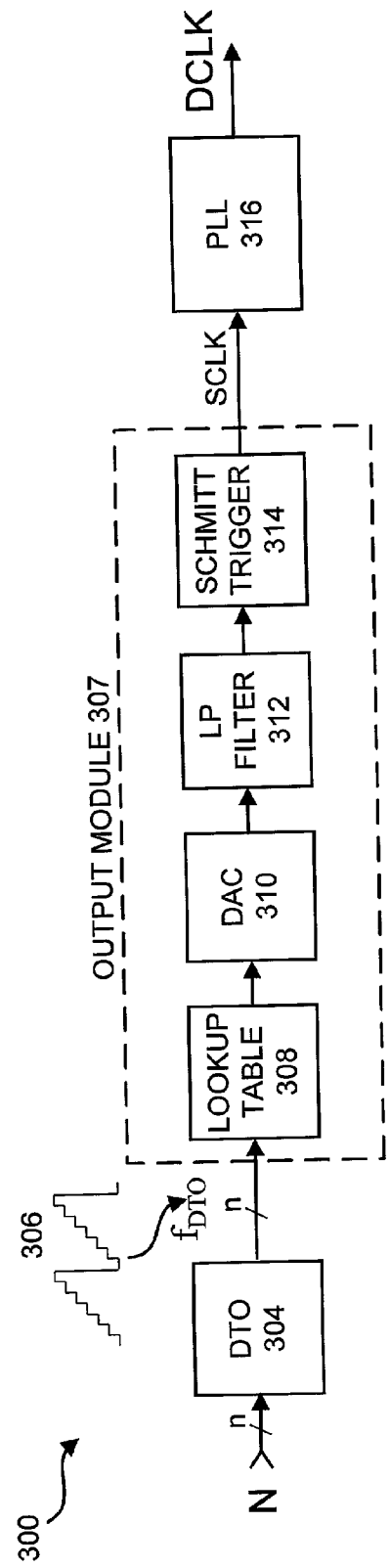
FIG. 3 illustrates an exemplary block diagram of a known DTO-based frequency converter.
Figure 4:
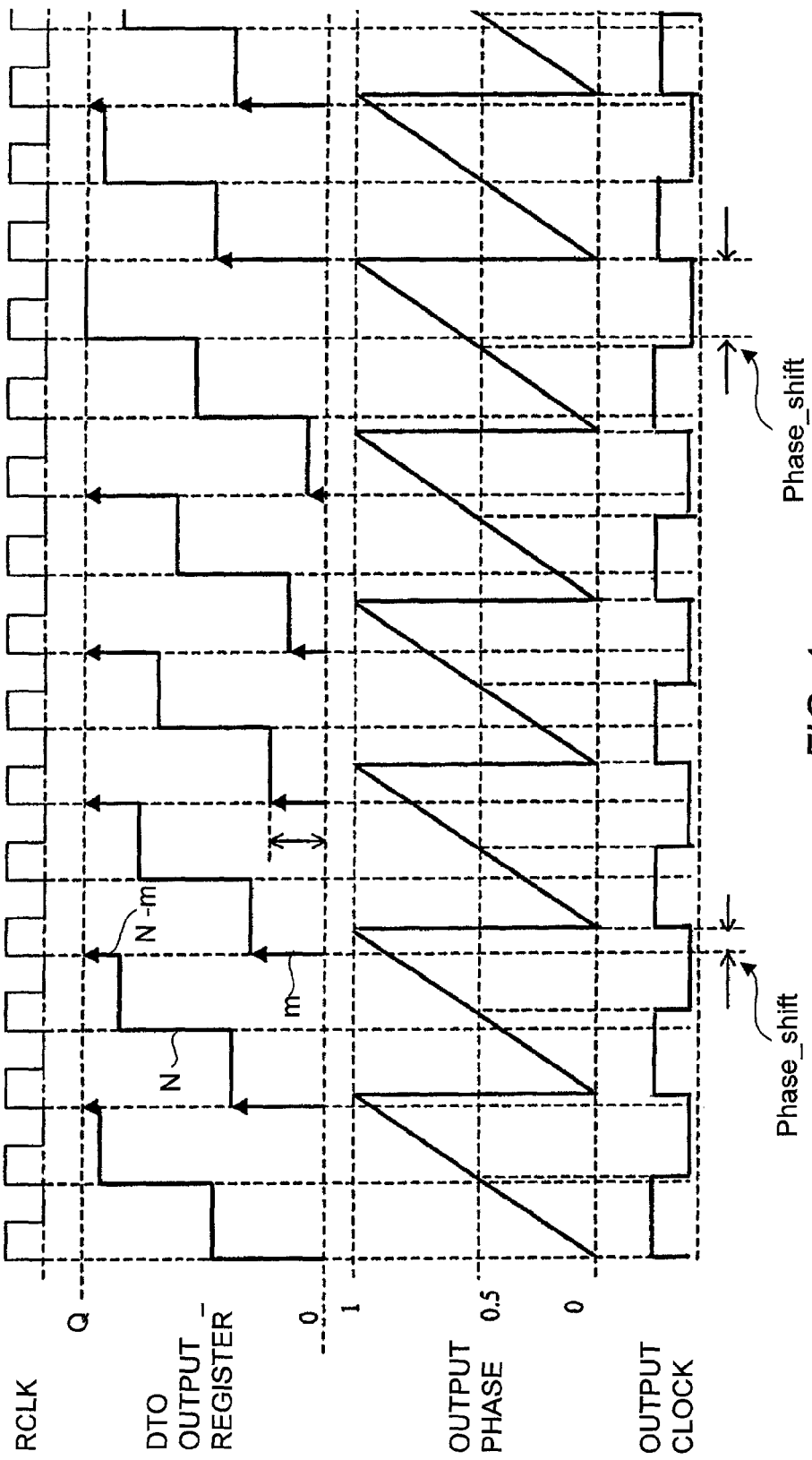
FIG. 4 is a waveform diagram illustrating the observed periodic phase shift error that occurs in DTO outputs.

Before describing the all-digital frequency converter of present invention in detail, it is helpful to first understand why the DTO shown in FIG. 2 is not suitable for synchronous frequency conversion. One significant observation that can be made is that there is a phase shift (Phase_shift) between the rising edge of reference clock and the rising edge of output clock that occurs at each new period of the DTO as shown in the waveform diagram in FIG. 4. In the Figure, the DTO output register increments by N at each RCLK until it reaches its maximum count represented by the value $Q=2^n$, where n is the number of bits in the DTO. When the maximum count, Q, is reached a carry is generated that signals the start of next period, and the remaining part of N that exceeds Q is wrapped around by the DTO's modulo adder. The part of N that wraps around is represented as m in the Figure, and the portion of N that does not wrap around is given by the difference N−m. The value in the DTO output register is the phase of the output signal that synchronously corresponds to the front edge of RCLK. An output clock signal is generated having an output phase shown in the figure as a periodic ramp signal that starts from a phase of zero at the rising edge of the output clock, and linearly ramps to a value of one at the next rising output clock edge. The falling edge of the output clock occurs at an output phase 0.5. That is, when the count Q/2 is reached the carry through count Q/2 is generated, which signals the start of the second half of the period, and remaining part of N that exceeds Q/2 (m) contains information about the position of falling edge relative to front edge of RCLK. It should to be noted, that many values of the DTO output may be determined as values that if they are reached can generate raising or falling edge of output clock. For example, the rising edge of output clock may be generated if the count Q/2 or Q is reached, and falling edge may be generated if the count Q/4 or 3Q/4 is reached. However, there is cumulative phase difference between RCLK and the output clock, represented by the value Phase_shift, that corresponds to the described wrap-around effect of the DTO's output. The phase difference, or Phase_shift, between front edge of RCLK and the rising/falling edge of the output signal can be calculated as shown in Equation (2) below:

$$\text{Phase\_shift} = \frac{(N-m) \times T_{RCLK}}{N} \quad (2)$$

where $T_{RCLK}$ is the period of RCLK. Typically, an output module including a DAC, a low-pass filter, and an analog PLL is used to remove the phase error Phase_shift from the output clock, thereby achieving a synchronous frequency converter. However, the present invention avoids analog components by providing the digital circuits that uses special signals derived from RCLK that are used to produce a substantially synchronous output clock signal having a deterministically controlled phase error. In one embodiment of the present invention, a multiplicity of time shifted reference clock signals (RCLK) are created to generate gated pulses that produce an output clock signal having a maximum phase error that is equal to the time shift between the said reference clock signals.

Figure 5:
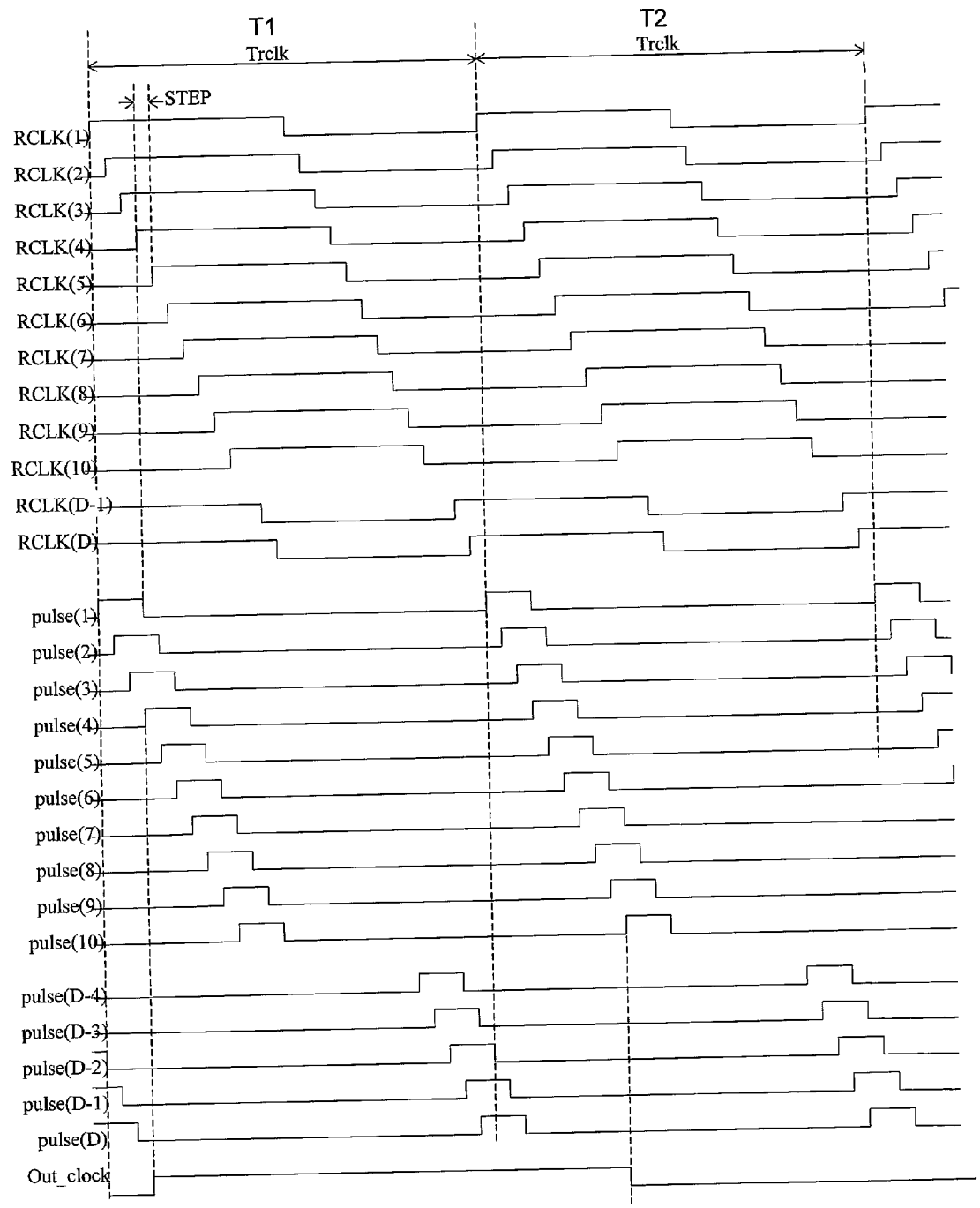
FIG. 5 illustrates a waveform diagram of an exemplary set of time shifted waveforms that are used to produce the output clock signal, Out_clock, according to an embodiment of the present invention.

The waveform diagram shown in FIG. 5 illustrates an exemplary set of time shifted waveforms that are used to produce the output clock signal, Out_clock, according to an embodiment of the present invention. An exemplary set of time-shifted RCLK waveforms RCLK(2)–RCLK(D) is illustrated in the waveform diagram of FIG. 5, whereby each successive reference clock signal after the original reference clock RCLK(1) is time shifted ahead of the previous reference clock by a predetermined value, STEP. In one embodiment, the gated pulses, e.g., pulse(1)–pulse(8), used to produce the final output clock signal are formed by selecting appropriate pairs of time shifted RCLK rising edges to create the rising and falling edges of the gated pulses. For the example shown in the Figure, the rising edge of pulse(1) corresponds to the rising edge of RCLK(1) and the falling edge of pulse(1) corresponds to the rising edge of time shifted RCLK(4). In other embodiments, the gated pulses are instead generated by using the time-shifted RCLK signals as pulse triggers in known pulse generating circuits, whereby the rising pulse edges substantially align with the corresponding the rising edges of the time-shifted RCLK signals used as pulse triggers. The total number of pulses between two rising edges of RCLK(D) is equal to the number of possible positions for the edge of the output clock. The desired period of the Out_clock signal is determined by which delayed pulses are selected to trigger the rising and falling edges of Out_clock. Referring again to the example shown in FIG. 5, the rising edge of the output clock (Out_clock) is created by pulse(4) and the falling edge is created by pulse(10) during the next RCLK period, T2. To increase the output clock period, a pulse in subsequent RCLK periods (not shown) can be selected to reset the Out_clock signal. Thus, an arbitrary output clock period can be generated by selecting the appropriate time-shifted pulses. It should be noted that the pulses that are selected to set or reset the output latch correspond to RCLK periods when a carry through count Q or count Q/2 is generated by the DTO.

In the present embodiment, one pulse from the set of D pulses is selected to set an output latch at the RCLK period when a carry through the count Q is produced, and one pulse from the set of D pulses is selected to reset output latch at the RCLK period when carry through the count Q/2 is produced. The duration of each pulse is preferably designed to be long enough to meet the timing (e.g., set-up and hold)

requirements of set-reset (S-R) output latch used to generate the output clock signal. The value of D represents the duration of the RCLK period. The particular pulse number that is to be selected to appropriately set/reset the output latch represents Phase_shift, and Equation (2) can be written in another way as shown by Equation (3) below:

$$\text{pulse\_num} = \frac{(N-m) \times D}{N} \quad (3)$$

where pulse_num is the delayed pulse number (e.g., pulse (2)) that has the time shift relative to the rising edge of RCLK that corresponds to Phase_shift in Equation (2), and D is the number of pulses between two front edges of RCLK. The 'N–m' term is determine as shown in Equation (4) below:

$$N-m=2^n-dto\_val \quad (4)$$

where dto_val is the value in the DTO at the RCLK period before the clock period where a carry is generated through the count Q. This value of N–m is used for the calculation of the appropriate pulse_num that is selected to produce the rising edge of the output clock. To calculate the value of pulse_num to be selected to produce the falling edge of the output clock, the 'N–m' term is determine as shown in Equation (5) below:

$$N-m=2^{n-1}dto\_val \quad (4)$$

where dto_val is the value in the DTO at the RCLK period before the clock period where a carry is generated through the count Q/2.

Generally, a sufficiently large number, D, of time-shifted, or delayed, RCLK, and pulse signals are created such that two of the pulses out of the multiplicity can be selected to set and reset the output latch during the RCLK period with a carry generated through the count Q for set and with a carry generated through the count Q/2 for resetting the output latch, thereby generating the desired output clock signal. Hence, the accuracy of setting the output clock edge relative to its ideal position is substantially limited by the duration of the delay parameter, STEP. In particular, the value of STEP determines the maximum jitter of the edges of the output clock.

Figure 6A:
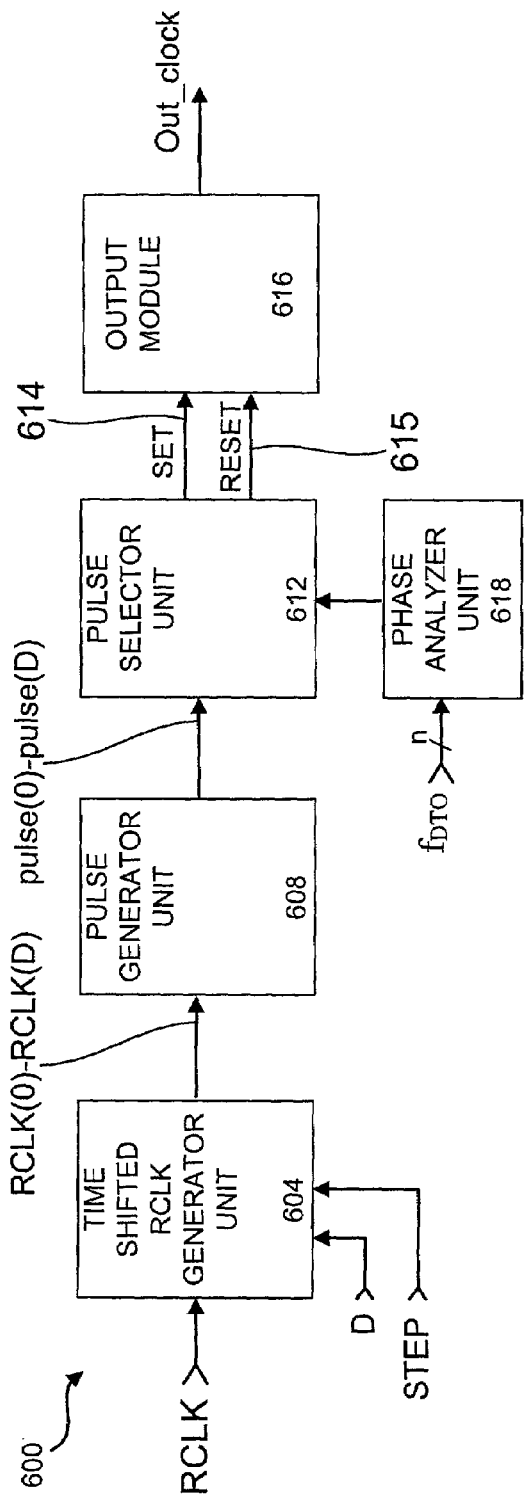
FIG. 6A illustrates a block diagram of a digital frequency conversion system that produces a substantially synchronous output clock signal, according to an embodiment of the present invention.

The block diagram in FIG. 6a illustrates a general embodiment of the present invention, whereby an all-digital frequency converter system 600 produces a substantially synchronous output clock signal Out_clock, by selecting the appropriate time-shifted pulses to set and reset Out_clock such that Phase_shift error is substantially deterministic. Digital system 600 exemplifies a system configuration that produces the signals described in FIG. 5. Specifically, the input reference clock signal, RCLK, is fed into a time shifting unit 604 to generate D time-shifted RCLK signals RCLK(1)–RCLK(D) that are fed into a pulse generator unit 608 coupled thereto, where the number of time-shifted RCLK signals is determined by the input parameter D. Note that RCLK(0) is the reference RCLK, and is simply passed through time shifting unit 604. Furthermore, the amount of time, STEP, each subsequent RCLK signal should be delayed after the previous time-shifted RCLK signal is set by the input parameter STEP. It should be noted that in other embodiments only the time-shifted RCLK signals that are used to generate the desired Out_clock waveforms are generated in time shifting unit 604, whereby the number of time-shifted RCLK signals and pulses generated could potentially be less than D for such an embodiment. The pulse generator unit 608 creates the pulses pulse(0)–pulse(D) that are selectively gated by a pulse selector unit 612 to appropriately drive the Set and Reset lines of an output module 616. A phase analyzer unit 618 receives an n-bit DTO output signal, $f_{DTO}$, that is analyzed to mark certain phase positions, e.g., the beginning and middle, of the DTO output period. This information is transmitted to pulse selector unit 612, and is used by pulse selector unit 612 to appropriately determine which pulses pulse(0)–pulse(D) should pass through pulse selector unit 612 as output clock Set 614 or Reset 615 signals to output module 616. Output module 616 may be embodied in multiple ways that all achieve the functionality of asserting a high Out_clock state after a set signal 614 is detected and a low Out_clock state after a reset signal 615 is detected.

Figure 6B:
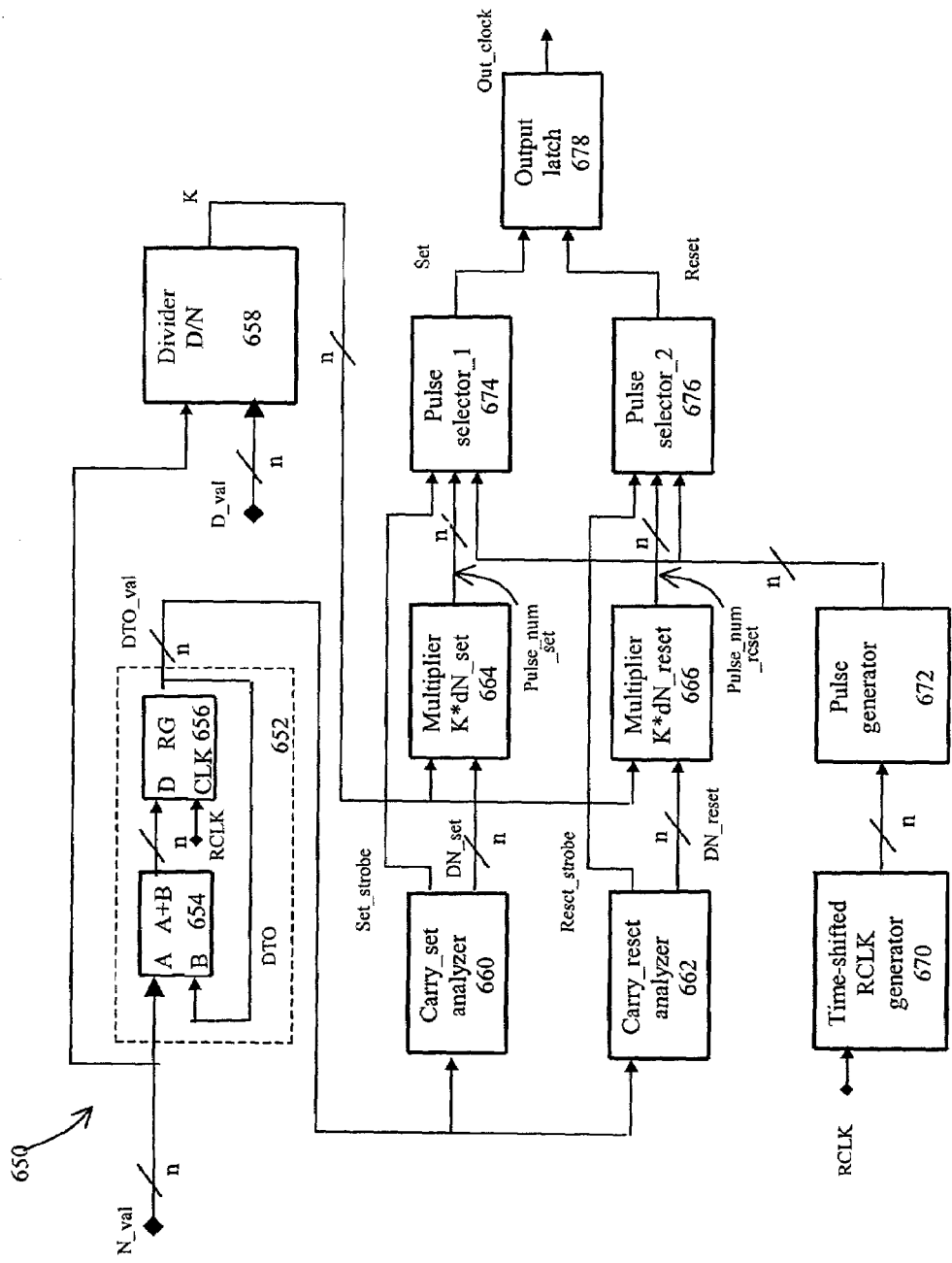
FIG. 6B illustrates a detailed embodiment of the present invention whereby the digital frequency converter system produces a substantially synchronous output clock signal.

The block diagram in FIG. 6b illustrates a detailed embodiment of the present invention, whereby the digital frequency converter system produces a substantially synchronous output clock signal, Out_clock, by selecting the appropriate time-shifted pulses to set and reset Out_clock such that the jitter of out_clock is substantially reduced. The more detailed implementation shown FIG. 6b relates to FIG. 6a as follows: the phase analyzer unit 618 comprises functional blocks 660 and 662; pulse selector unit 612 comprises functional blocks 658, 664, 666, 674, and 676; and DTO output signal, $f_{DTO}$ is generated by DTO 651. The remaining functional blocks have a one to one correspondence; i.e., unit 604 corresponds to block 670, unit 608 to 672, and output module 616 to latch 678. The current phase of the output signal is produced by discrete-time oscillator (DTO) 652, which includes an adder 654, and a register 656 that is clocked by a constant frequency reference clock RCLK. The DTO output is a staircase n-bit signal DTO_val. The frequency of the DTO output signal is proportional to a DTO input signal N_val that can be treated as scale factor of the DTO. The digital frequency converter 650 exemplifies a detailed system configuration that produces the signals described in FIG. 5. Specifically, the input reference clock signal, RCLK, is fed into a time shifting unit 670 to generate the set of time-shifted RCLK signals, where the number of the delayed signals between two rising edges of RCLK is set by the value D_val, and each successive RCLK signal is delayed from the previous by the value STEP. Pulse generator 672 receives the output signals of time-shifted RCLK generator 670, and creates the set of time-shifted pulses. The n-bit output signal K of divider 658 is the result of dividing D_val by the scale factor N_val, or N. The output of DTO 652 (DTO_val) feeds the inputs of two units: a carry_set analyzer 660 and a carry_reset analyzer 662. Carry set analyzer 660 determines the RCLK period with carry through the maximum count Q, and it creates two output signals: strobe Set_strobe which marks the RCLK period having a carry, and n-bit DN_set is a value that is equal to the difference between Q and the DTO_val at the RCLK period before the period when the carry is generated. Similarly, a carry reset analyzer 662 determines the RCLK period having a carry through the count Q/2, and it creates two output signals: strobe Reset_strobe which marks the RCLK period having a carry, and n-bit DN_reset signal is a value that is equal to the difference between Q/2 and the DTO_val at the RCLK period before the period when the carry is generated. Multiplier 664 calculates the delayed pulse number, Pulse_num_set, that has to be used to set output latch 678 in accordance with Equation (3). Similarly, multiplier 666 calculates the delayed pulse number, Pulse_num_reset, that has to be used to reset output latch in accordance with Equation (3). A pulse selector 674 selects one of the pulses from pulse generator 672 that corresponds to Pulse_num_set and uses this pulse to assert the output signal Set if input signal Set_strobe is asserted. A pulse selector 676 selects one of the pulses from pulse generator 672 that corresponds to Pulse_num_reset and uses this pulse to assert the output signal Reset if input signal Reset_strobe is asserted. Output latch 678 creates the frequency converter output signal Out_clock.

Figure 7:
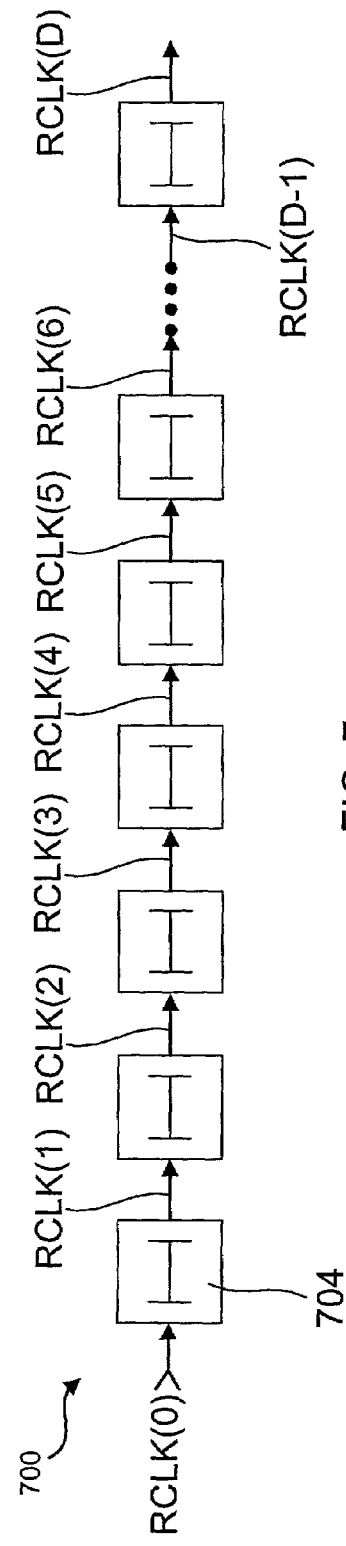
FIG. 7 illustrates a block diagram of a delay-line that can produce the time-shifted reference clock (RCLK) signals shown in FIG. 5, according to an embodiment of the present invention.

It should also be noted that the digital circuitry that produces the required time-shifted RCLK signals in time shifting unit 604 could be implemented in many different ways. In one embodiment, the multiplicity of time-shifted RCLK signals is produced by a delay-line 700 shown in FIG. 7, where a chain of D or more known delay elements 704 are serially connected and tapped at each junction node to produce successfully time-shifted RCLK waveforms RCLK(1)–RCLK(D) shown in FIG. 5. In the present embodiment, delay elements 704 have the same fixed time delay equal to the STEP above. In some embodiments, however, delay elements 704 have a selectable time delay.

Figure 8A:
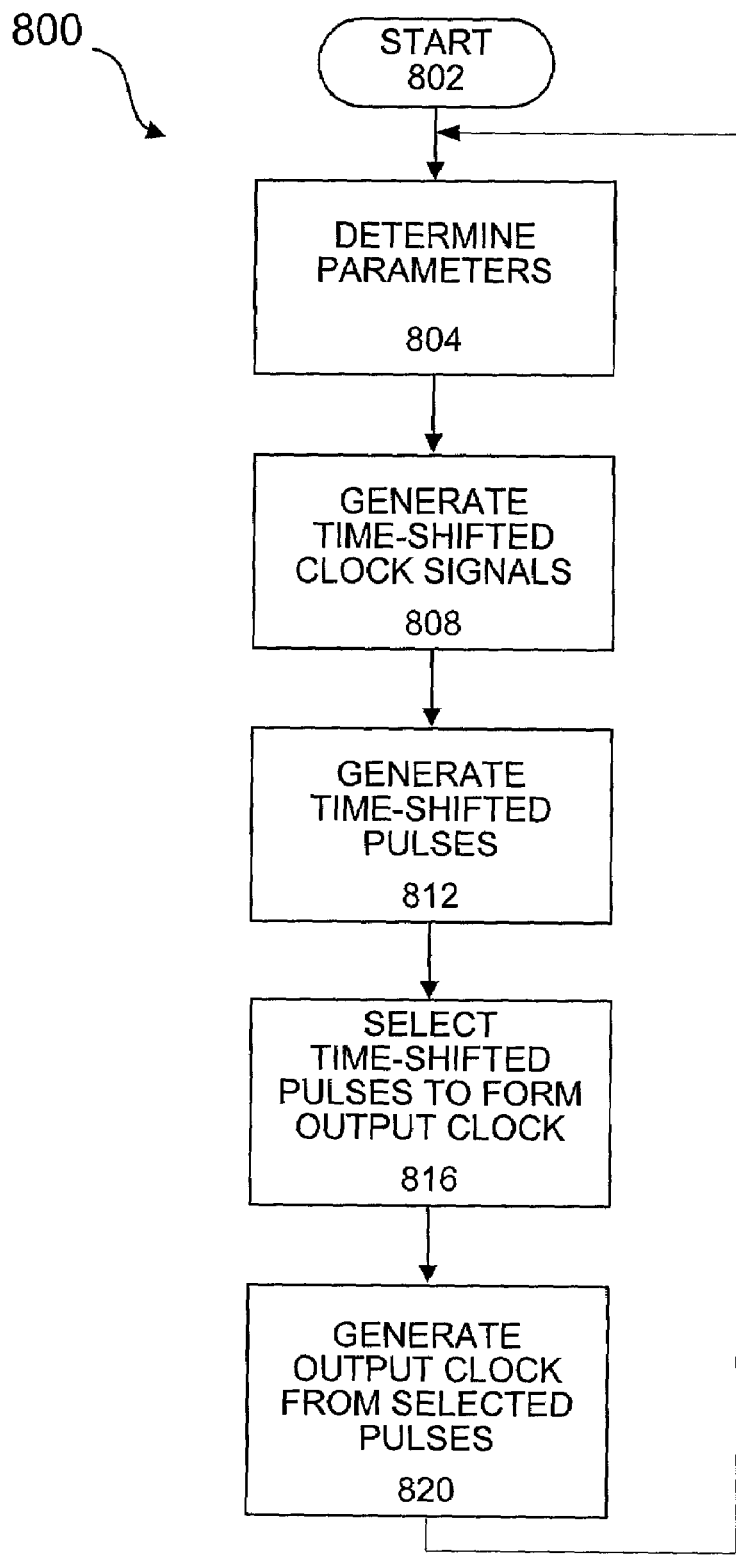
FIG. 8A illustrates a flowchart of a general method to achieve a substantially synchronous frequency converter according to an embodiment of the present invention.

Referring again to FIG. 6a, those of ordinary skill in the art of digital design will appreciate that the pulse signal generation in pulse generator unit 608 and the pulse selection mechanism in pulse selector unit 608 can be implemented in several known ways that suit the particular application while operating within the scope of the herein described general method to produce a substantially synchronous digital frequency converter. FIG. 8a illustrates a flowchart of a general method 800 to achieve a substantially synchronous frequency converter according to an embodiment of the present invention. The present frequency conversion process begins at 802 by determining the appropriate frequency setting parameters, at 804, such as the frequency setting N_val and the number of pulses between two front edges of RCLK D_val , and pulse_num select values. However, in some embodiments, parameter values may, instead, be calculated at any step in the frequency conversion method 800 before the particular parameter is required. The multiplicity of time-shifted reference clock signals is produced at 808 and the corresponding multiplicity of time-shifted pulses at 812. It should be noted that in other embodiments the time-shifted reference clock signals may be generated before or concurrently with step 804. The time-shifted pulses corresponding to the desired phase-corrected output signal are selected at 816 according to the pulse_num set and pulse_num reset select parameters. In the present embodiment, the set and reset pulses are timed to synchronize with the start and middle of the DTO reference signal period. However, other embodiments may choose other trigger points to emit the selected set and reset signals. Continuing with the present embodiment, the time-shifted pulses that correspond to the desired rising and falling edges of the output clock signal are used at 820 to generate the rising and falling edges of the output clock signal. The process repeats at 804 to generate the output clock signal for the next output clock period. Moreover, it should be appreciated that the described steps are exemplary, and that in several circumstances the order of the various steps may be changed, some steps eliminated or combined, and others added.

Figure 8B:
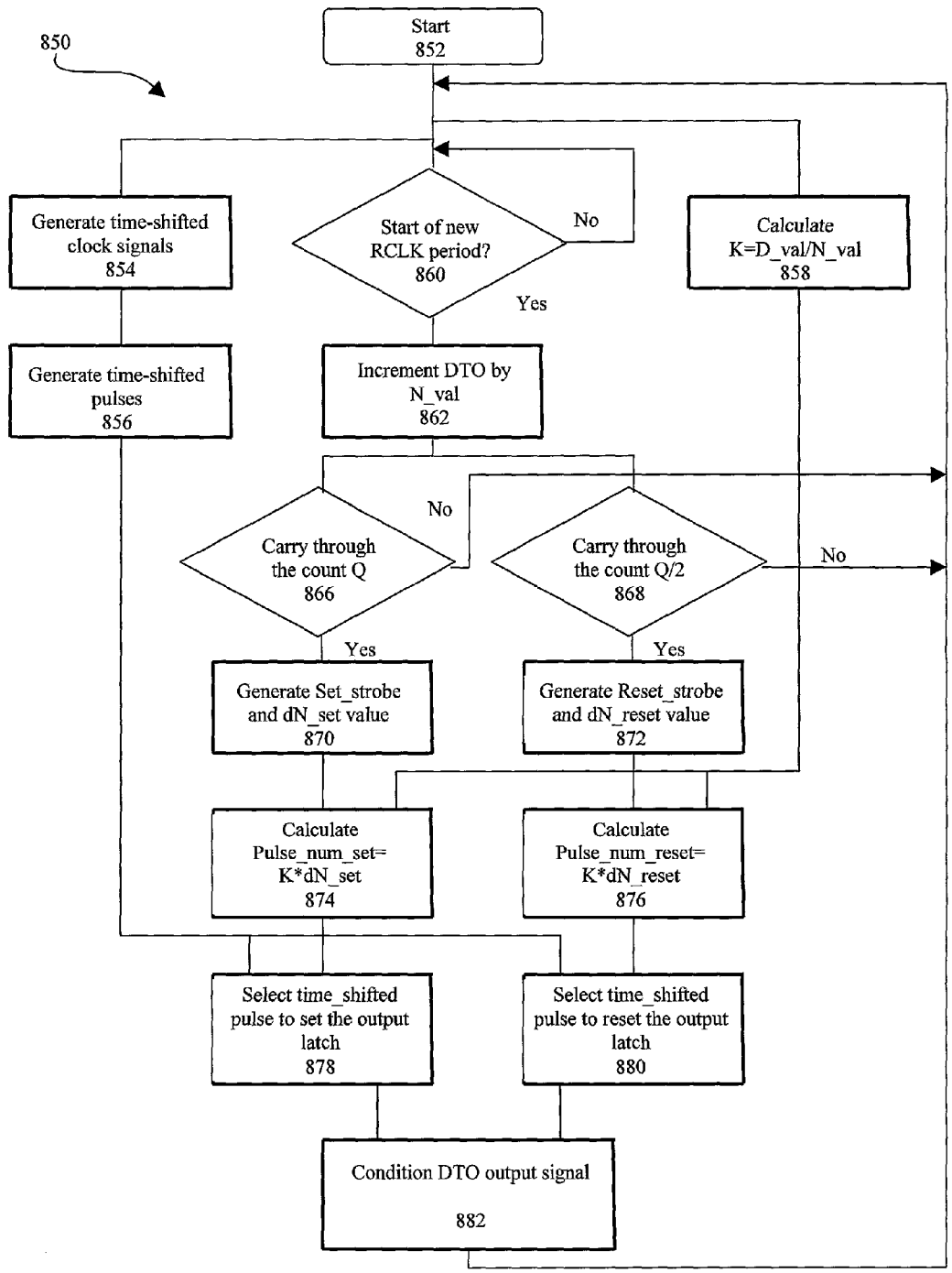
FIG. 8B illustrates a flowchart of a detailed method to achieve a substantially synchronous frequency converter according to an embodiment of the present invention.

FIG. 8b illustrates a flowchart of a detailed method 850 to achieve a substantially synchronous frequency converter according to an embodiment of the present invention. The present frequency conversion process begins at 852 by determining the appreciate frequency setting N_val and the number of pulses between two front edges of RCLK D_val. The multiplicity of time shifted reference clocks is produced at 854 and corresponding multiplicity of time-shifted pulses at 856. The coefficient K=D_val/N_val is produced at 858. The process starts after the rising edge of RCLK at 860 by incrementing the DTO by the value of scale factor N_val at 862. Thereafter, there are two independent and potentially concurrent branches. The first branch includes steps 866, 870, 874, 878 that set the output latch. The second branch includes steps 868, 872, 876, 880 that reset output latch. At 866, the DTO output signal is analyzed for carry through the maximum count Q. If a carry is produced, then the dN_set value and Set_strobe are generated at 870. Signal Set_strobe marks the RCLK period having a carry, and the n-bit dN_set value is equal to the difference between Q and the DTO output at the RCLK period before period the carry is generated. The calculation number of Pulse_num_set is performed at 874, where the value of Pulse_num_set determines which delayed pulse will subsequently set the output latch. The delayed pulse corresponding to Pulse_num_set is selected at 878 and is used at 882 to set the output latch. The same procedure is used to reset the output latch at steps 868, 872, 876, 880. It should be noted that in some embodiments step 858 might be excluded. Additionally, in other embodiments steps 874 and 876 may be excluded. Moreover, it should be appreciated that the described steps are exemplary, and that in several circumstances the order of the various steps may be changed, some steps eliminated or combined, and others added.

Figure 9:
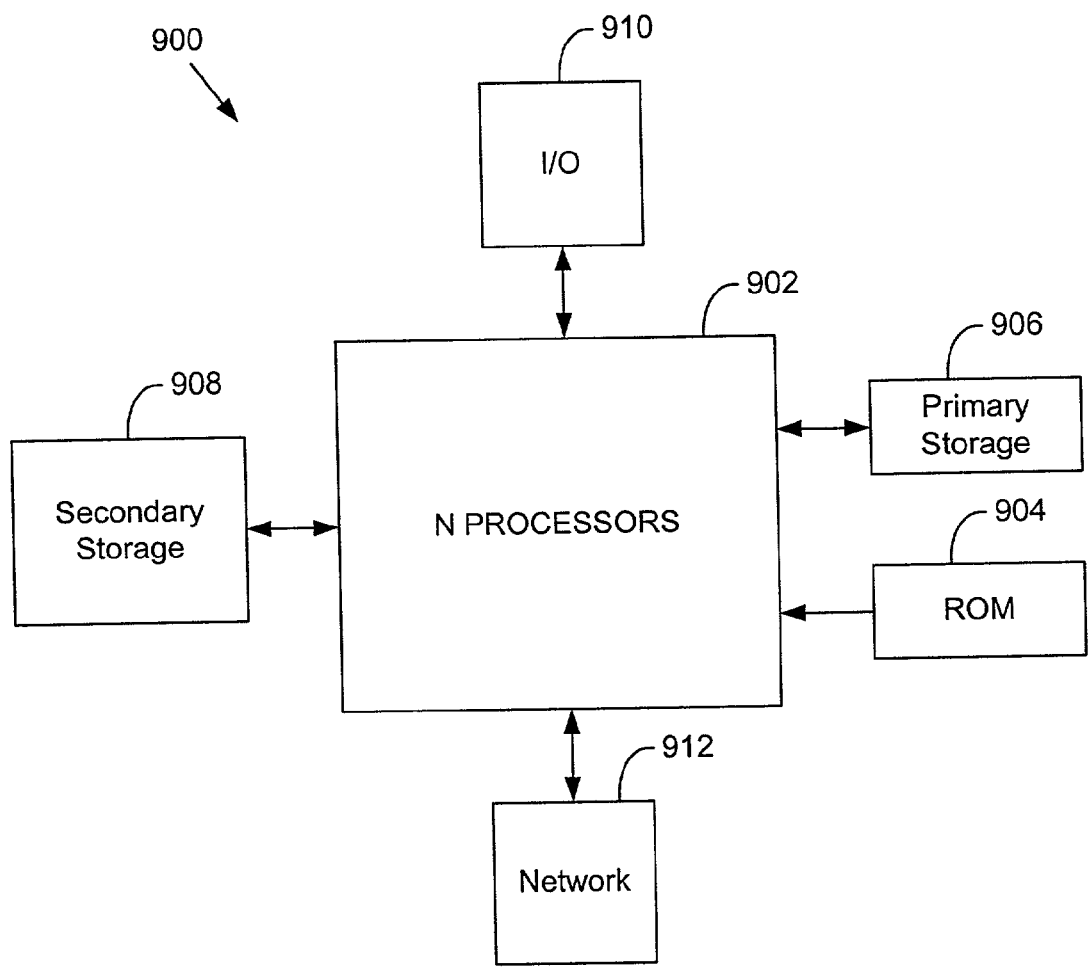
FIG. 9 is a diagrammatic representation of a general-purpose computer system suitable for implementing the present invention.

FIG. 9 illustrates a computer system 900 employed to implement the invention. As is well known in the art, ROM acts to transfer data and instructions uni-directionally to the CPUs 902, while RAM is used typically to transfer data and instructions in a bi-directional manner. CPUs 902 may generally include any number of processors. Both primary storage devices 904, 906 may include any suitable computer-readable media. A secondary storage medium 908, which is typically a mass memory device, is also coupled bi-directionally to CPUs 902 and provides additional data storage capacity. The mass memory device 908 is a computer-readable medium that may be used to store programs including computer code, data, and the like. Typically, mass memory device 908 is a storage medium such as a hard disk or a tape which generally slower than primary storage devices 904, 906. Mass memory storage device 908 may take the form of a magnetic or paper tape reader or some other well-known device. It will be appreciated that the information retained within the mass memory device 908, may, in appropriate cases, be incorporated in standard fashion as part of RAM 906 as virtual memory. A specific primary storage device 904 such as a CD-ROM may also pass data uni-directionally to the CPUs 902.

CPUs 902 are also coupled to one or more input/output devices 910 that may include, but are not limited to, devices such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. Finally, CPUs 902 optionally may be coupled to a computer or telecommunications network, e.g., an Internet network or an intranet network, using a network connection as shown generally at 912. With such a network connection, it is contemplated that the CPUs 902 might receive information from the network, or might output information to the network in the course of performing the above-described method steps. Such information, which is often represented as a sequence of instructions to be executed using CPUs 902, may be received from and outputted to the network, for example, in the form of a computer data signal embodied in a carrier wave. The above-described devices and materials will be familiar to those of skill in the computer hardware and software arts.

Although only a few embodiments of the present invention have been described in significant detail, it should be understood that the present invention may be embodied in many other specific forms without departing from the spirit or scope of the invention. For example, although the illustrated embodiments were shown to have one output clock period per DTO output period with certain predetermined positions of the DTO output signal (i.e., Q and Q/2) corresponding to the edges of output clock, it should be understood that in other embodiments these edge transition positions may be changed and the number of positions may be increased. Therefore, the present examples are to be considered as illustrative and not restrictive, and the invention is not be limited to the details given herein, but may be modified within the scope of the appended claims.

I claim:

1. In a frequency conversion device, a method of frequency conversion, the method comprising the steps of:
   determining a plurality of frequency setting parameters;
   generating a plurality of time-shifted signals, wherein the plurality of frequency setting parameters includes a first set of parameters required to generate the plurality of time-shifted signals that includes the amount of time shift and the number of delayed signals;
   selecting an appropriate time-shifted signal to set an output signal based on a first reference signal;
   selecting an appropriate time-shifted signal to reset the output signal based on the first reference signal; and
   generating the output signal that corresponds to the selected time-shifted set signal and the selected time-shifted reset signal.

2. The method as recited in claim 1 wherein the time shifted signal generation further comprises the step of:
   generating a plurality of time-shifted signals derived from a second reference signal.

3. The method as recited in claim 2 further comprising the step of:
   generating a plurality of time-shifted pulses derived from the plurality of time-shifted signals, wherein selecting the appropriate time-shifted signal selects from the plurality of time-shifted pulses.

4. The method as recited in claim 3 wherein selecting the appropriate time-shifted signals further comprises:
   determining the start of a new period of the first reference signal; and
   selecting the appropriate time-shifted signal to set the output only when at the start of the period.

5. The method as recited in claim 3 wherein selecting the appropriate time-shifted signals in further comprises:
   determining the middle of a period of the first reference signal; and
   selecting the appropriate time-shifted signal to reset the output only when at to middle of the period.

6. A system for digital frequency conversion, the system comprising:
   a processor arranged to determine a plurality of frequency setting parameters;
   a processor arranged to generate a plurality of time-shifted signals wherein the plurality of frequency setting parameters includes a first set of parameters required to generate the plurality of time-shifted signals that includes the amount of time shift and the number of delayed signals;
   a processor arranged to select the appropriate time-shifted signal to set an output signal based on a first reference signal;
   a processor arranged to select the appropriate time-shifted signal to reset the output signal based on the first reference signal; and
   an input/output device ranged to generate the output signal that corresponds to the set and reset signals.

7. The system as recited in claim 6 wherein the generation of the plurality of time-shifted signals further comprises:
   a processor arranged to generate a plurality of time-shifted signals derived from a second reference signal.

8. The system as recited in claim 7 further comprising:
   a processor arranged to generate a plurality of time-shifted pulses derived from the plurality of time-shifted signals, wherein the signals selected to set and reset the output signal are selected from the plurality of time-shifted pulses.

9. Computer program product for frequency conversion in a frequency conversion unit, comprising:
   computer code for determining a plurality of frequency setting parameters;
   computer code for generating a plurality of time-shifted signals wherein the plurality of frequency setting parameters includes a first set of parameters required to generate the plurality of time-shifted signals that includes the amount of time shift and the number of delayed signals;
   computer code for selecting an appropriate time-shifted signal to set an output signal based on a first reference signal;
   computer code for selecting an appropriate time-shifted signal to reset the output signal based on the first reference signal;
   computer code for generating the output signal that corresponds to the selected time-shifted set signal and the selected time-shifted reset signal; and
   computer readable medium for storing the computer code.

10. Computer program product as recited in claim 9, further comprising:
    computer code for generating a plurality of time-shifted signals derived from a second reference signal.

11. Computer program product as recited in claim 10 further comprising:
    computer code for generating a plurality of time-shifted pulses derived from the plurality of time-shifted signals, wherein selecting the appropriate time-shifted signal selects from the plurality of time-shifted pulses.

12. Computer program product as recited in claim 9 further comprising:
    computer code for determining the start of a new period of to first reference signal; and
    computer code for selecting the appropriate time-shifted signal to set the output only when at the start of the period.

13. A computer program product according to claim 9 wherein the computer-readable medium is one selected from the group consisting of a data signal embodied in a carrier wave, a CD-ROM, a hard disk, a floppy disk, a tape drive, and semiconductor memory.

14. An apparatus for digital frequency conversion, to apparatus comprising:
- a digital time shifting unit configured to receive a plurality of frequency setting parameters and output a plurality of time shifted signals based frequency setting parameters;
- a digital pulse generator unit coupled to the digital time shifted unit, wherein to digital pulse generator unit is configured to receive the plurality of time shifted reference signals, and output a plurality of time shifted pulses, wherein the plurality of frequency setting parameters includes a first set of parameters required to generate the plurality of time-shifted signals tat includes the amount of time shift and the number of delayed signals;
- a digital phase analyzer unit configured to receive a source signal having a first frequency and to output a phase information;
- a digital pulse selector unit coupled to the phase analyzer unit, and the pulse generator unit, wherein the digital pulse selector unit is arranged to output a set signal and a reset signal based upon the plurality of time shifted pulses and the phase information; and
- a digital output module coupled to the digital pulse selector unit, wherein the output module is arranged to generate a digital output signal having a second frequency based upon the set signal and the reset signal.

15. The apparatus of claim 14 wherein the pulse selector unit further comprises:
- a calculation unit arranged to calculate a second value based upon a frequency setting value corresponding to the source signal and a first value;
- a multiplier unit for providing a pulse selection value based upon the second value and the phase information; and
- a pulse selector module arranged to provide the corresponding time shifted pulses to the set signal or the reset signal based upon the pulse selection value.

16. The apparatus of claim 14 wherein the time shifting unit includes a delay-line.

17. The apparatus of claim 14 wherein the output module includes a set-reset latch.

* * * * *